United States Patent [19]

Ohtsuki et al.

[11] Patent Number: 4,663,525

[45] Date of Patent: May 5, 1987

[54] METHOD FOR ELECTRON GUN ALIGNMENT IN ELECTRON MICROSCOPES

[75] Inventors: Mitsuo Ohtsuki, Sunnyvale; Lloyd W. Denney, Menlo Park, both of Calif.

[73] Assignee: Nanometrics Incorporated, Sunnyvale, Calif.

[21] Appl. No.: 752,547

[22] Filed: Jul. 8, 1985

[51] Int. Cl.⁴ .................................... G01N 23/00
[52] U.S. Cl. .................. 250/307; 250/310; 250/396 R; 250/491.1
[58] Field of Search ............. 250/310, 396 R, 423 F, 250/491.1, 307; 324/404, 121; 378/205

[56] References Cited

U.S. PATENT DOCUMENTS

| | | | |
|---|---|---|---|
| 3,291,959 | 12/1966 | Schleich et al. | 250/396 R |
| 3,678,333 | 7/1972 | Coates et al. | 250/396 R |
| 3,766,427 | 10/1973 | Coates et al. | 250/423 F |
| 3,784,815 | 1/1974 | Coates et al. | 250/307 |

*Primary Examiner*—Bruce C. Anderson
*Attorney, Agent, or Firm*—Linval B. Castle

[57] ABSTRACT

In an electron microscope employing a multi-element electrostatic lens and a position adjustable electron emission gun, the gun tip must be in precise alignment with the very small apertures in the lens elements for high resolution imaging. If the tip is precisely aligned, there will be no variations in displacement of an image if the lens element potentials are varied; if there is misalignment, the image displacement will vary with voltage variations. Thus, proper alignment of the gun tip is easily and rapidly achieved by varying the lens element potential with an oscillator while adjusting the position of the gun tip to a zero image variation.

6 Claims, 2 Drawing Figures

METHOD FOR ELECTRON GUN ALIGNMENT IN ELECTRON MICROSCOPES

BRIEF SUMMARY OF THE INVENTION

This invention relates generally to electron microscopes and in particular to a method for the accurate alignment of the electron gun emission tip with the axis of the lens electrodes.

In most electron microscopes, and particularly in those employing field or Schottky emission, electron-optical alignment along the various electrodes is important. It is important that the tip be electron-optically aligned with the axis of the electron-optical centers of the electrostatic lens to achieve optimum image sharpness.

All electron microscopes employ mechanical adjustment means for longitudinally adjusting the emission tip for proper focus on a specimen and also employ lateral adjustment means for alignment of the tip with the electron-optical axis. It has heretofore been the practice to laterally adjust the tip in X-Y directions in a plane normal to the electrode axis by merely adjusting the tip position mechanically to obtain the best resolution. Such a procedure is very slow and often inaccurate.

The method to be described herein provides a very accurate and efficient procedure for the alignment of the electron gun emission tip with the electron-optical centers of the electrostatic lens of an electron microscope.

Briefly described, the method includes an addition of a voltage oscillator in a high voltage supply to one of the focusing electrodes. The DC electrode voltage is thus modulated with a variable amplitude low frequency ripple voltage. If the electron emitting tip is precisely aligned with the electron-optical center of the electrostatic lens, the ripple will not affect the electron beam deflection and the resulting image will not shift the image on the microscope viewing screen. When the emitting tip is displaced from the axis, the ripple will cause the image to shift and wobble. By observing the display screen, the precise alignment of the tip becomes a very easy matter.

BRIEF DESCRIPTION OF THE DRAWINGS

In the drawings which illustrate the theory of the tip alignment method.

DETAILED DESCRIPTION OF THE INVENTION

Figure 1:
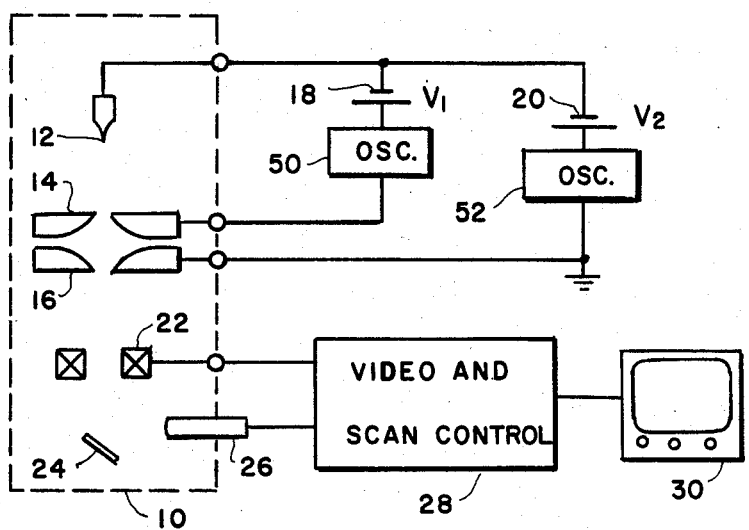
FIG. 1 is a simplified schematic drawing illustrating a typical scanning electron microscope for use with the tip alignment method.
Figure 2:
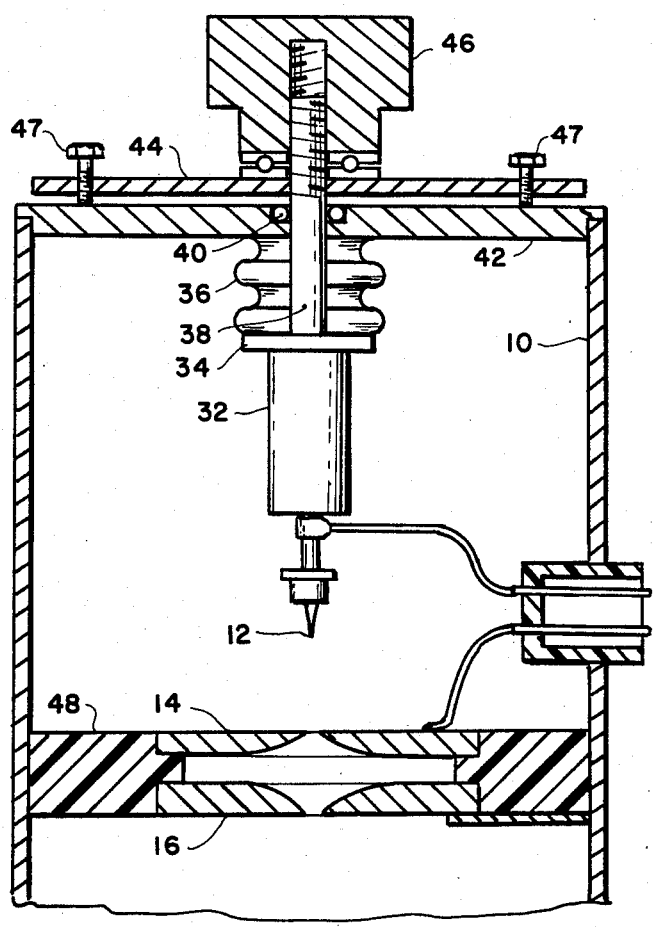
FIG. 2 is a detailed view illustrating a portion of an electron microscope showing a typical electron emission tip adjustment mechanism and first and second focusing electrodes.

FIG. 1 is a simplified schematic drawing of a typical scanning electron microscope and, together with the more detailed drawing of FIG. 2, is provided for a clearer understanding of the invention. In FIG. 1, an electron microscope chamber 10 has at one end an electron emission tip 12 having a very sharp point with a typical diameter of approximately a few hundred Angstroms to several thousand Angstroms from which the emitted electron beam must be aligned along an axis including through the apertures in the centers of a first electrode 14 and a second electrode 16. These apertures are very small and may have diameters of only about 10 to 100 microns. While most microscopes have additional electrodes not illustrated herein, the basic electrostatic lens comprises the two electrodes 14 and 16.

When the microscope vacuum chamber is evacuated and a positive extraction potential $V_1$ is applied by the voltage supply 18, the electron emission tip 12 will emit a stream of electrons which must pass through the small central aperture in the first electrode 14. A suitable positive potential between the tip 12 and second electrode 16, provided by the voltage supply 20, will accelerate the beam through deflection coils 22 and focus it on the surface of an object 24. Secondary emission electrons emitted from the object surface by the bombardment of the beam are detected by a scintillator 26, amplified by the video and scan control 28 and the image of the object is displayed on display 30.

FIG. 2 is a detailed view of a portion of an electron microscope illustrating the first and second electrodes 14, 16, the electron emission tip 12 and typical adjustment hardware such as shown in the U.S. Pat. No. 3,678,333 to Coates and Welter.

In FIG. 2, the emission tip 12 is attached to a long column including a ceramic insulating post 32 providing high voltage isolation from a circular cup 34 into which is cemented one end of a bellows 36. One end of an adjustment screw 38 is welded to the center of the cup 34 and the screw extends through an O-ring seal 40 centered in the end cap 42 of the microscope and through an axial hole in a tilt plate 44 to a vertical adjustment knob 46. Rotation of the knob 46 vertically adjusts the position of the tip 12 along the optical axis and provides a means for changing the tip to first electrode distance.

Horizontal adjustment of the tip 12 in an X-Y direction in a plane normal to the optical axis is accomplished by adjusting the screws 47 to adjust the angle of the tilt plate 44. As the tilt plate is adjusted from a position parallel with the end cap 42, the emission tip 12 which depends from the insulator 32 and shaft 38 will swing along an arc approximately centered at the O-ring. Thus, the adjustment of the tilt plate 44 will correspondingly adjust the position of the emission tip with respect to the axis.

FIG. 2 also illustrates the first and second electrodes 14, 16 mounted as an assembly in suitable insulators 48. The electrodes of the illustrated assembly, often referred to as a Butler lens, are toroidal and have a cross section substantially as shown with each having an axial aperture with a diameter of only about 1,000 microns.

Alignment between the emission tip 12 and the apertures in the electrodes 14, 16, is necessary for final high resolution imaging and is carried out by adjusting the position of the emission tip while observing the displayed image so that an image shift caused by any misalignment can be observed. If there is misalignment, the displayed image will be seen to shift or wobble toward or away from the electron-optical axis.

According to the invention, the adjustment of the emission tip 12 is made while changing the ratio of voltages of two or more anodes and while observing the image. Such voltage changes result in a corresponding change of amplitude or strength of the electrostatic lens. The displayed image produced by potential variations to the lens will not move if the alignment between the emission tip and the electrostatic lens is perfect.

FIG. 1 illustrates a voltage oscillator 50 in the circuit with the extraction voltage source 18 and a second oscillator 52 associated with the acceleration voltage source 20. Either the extraction voltage or the acceleration voltage may be varied by its respective oscillator; however, the preferred method is to vary the extraction voltage so that the final accelerating voltage is unaffected. The higher the amplitude of the oscillator voltage, the greater the image deflection will be observed in the display 30. Therefore the preferred method is to apply an high oscillator voltage at a frequency chosen between about 0.01–1000 Hz, and decrease the voltage amplitude as the tip 12 is adjusted to a position closer to the axis. When precise adjustment has been completed, there will be no observed movement of the image due to the oscillating voltage.

We claim:

1. In an electron microscope employing a position adjustable electron emission tip, a toroidal electrostatic lens downstream of said tip, detecting means for displaying an image of an object bombarded by the electrons emitted from said tip, and a voltage source coupled between said emission tip and said electrostatic lens, a method for adjusting the position of said emission tip in a plane normal to the optical axis of the microscope and into alignment with the electro-optical center of said electrostatic lens, said method comprising the steps of:

varying the amplitude of the voltage source and adjusting the position of the electron emission tip to a position where the displayed image ceases to vary with said varying amplitude.

2. The method claimed in claim 1 wherein said electrostatic lens comprises a toroidal extraction electrode coupled to a first voltage source and a toroidal acceleration electrode coupled to a second voltage source, the apertures through said extraction and acceleration electrodes forming an axis upon which said electron emission tip must be aligned for optimum image resolution.

3. The method claimed in claim 2 wherein said step of varying the amplitude is by use of a variable voltage oscillator for modulating said second voltage source at a frequency chosen between 0.01 and 1000 Hz.

4. The method claimed in claim 3 wherein the amplitude of said variable voltage is high for initial emission tip adjustments and is decreased in amplitude as said emission tip is adjusted into closed alignment with the axis of said electrostatic lens.

5. The method claimed in claim 2 wherein said step of varying the amplitude is by use of a variable voltage oscillator for modulating said first voltage source at a frequency chosen between 0.01 and 1000 Hz.

6. The method claimed in claim 5 wherein the amplitude of said variable voltage is high for initial emission tip adjustments and is decreased in amplitude as said emission tip is adjusted into closer alignment with the axis of said electrostatic lens.

* * * * *